United States Patent [19]

Mori

[11] Patent Number: 5,124,764
[45] Date of Patent: Jun. 23, 1992

[54] SYMMETRIC VERTICAL MOS TRANSISTOR WITH IMPROVED HIGH VOLTAGE OPERATION

[75] Inventor: Kiyoshi Mori, Stafford, Tex.

[73] Assignee: Texas Instruments Incorporated, Dallas, Tex.

[21] Appl. No.: 635,423

[22] Filed: Jan. 3, 1991

Related U.S. Application Data

[63] Continuation of Ser. No. 485,806, Feb. 23, 1990, abandoned, which is a continuation of Ser. No. 135,489, Dec. 21, 1987, abandoned, which is a continuation of Ser. No. 921,727, Oct. 21, 1986, abandoned.

[51] Int. Cl.$^5$ .............................................. H01L 29/78
[52] U.S. Cl. .................................... 357/23.4; 357/23.8
[58] Field of Search ................. 357/23.4, 23.8, 68, 357/55, 23.1, 89

[56] References Cited

U.S. PATENT DOCUMENTS

| | | | |
|---|---|---|---|
| 3,518,509 | 6/1970 | Cullis | 357/42 |
| 3,893,155 | 7/1975 | Ogiue | 357/42 |
| 4,462,040 | 7/1984 | Ho et al. | 357/23.4 |
| 4,589,004 | 5/1986 | Yasuda et al. | 357/23.4 |
| 4,630,088 | 12/1986 | Ogura et al. | 357/55 |
| 4,740,826 | 4/1988 | Chatterjee | 357/23.4 |
| 5,016,068 | 5/1991 | Mori | 357/23.4 |

FOREIGN PATENT DOCUMENTS

| | | | |
|---|---|---|---|
| 2003068 | 11/1969 | France | 357/23.4 |
| 56-29362 | 3/1981 | Japan | 357/23.4 |
| 61-142774 | 6/1986 | Japan | 357/23.4 |

OTHER PUBLICATIONS

*Semiconductor Devices*, S. M. Sze, pp. 200–207 (New York, John Wiley and Sons: 1985).

*Primary Examiner*—William D. Larkins
*Attorney, Agent, or Firm*—Theodore D. Lindgren; Richard L. Donaldson

[57] ABSTRACT

An MOS transistor having a vertical channel disposed along the sides of a trench is disclosed. The transistor is formed in an epitaxial layer on a substrate, with the channel region formed within the epitaxial layer by way of ion implantation and diffusion; the ion implantation is done in such a manner that the epitaxial layer is divided into a portion above the channel region (source region) and a portion below the channel region (drain region). A trench is etched to extend through the epitaxial region into the substrate, gate oxide is grown along the sides of the trench, and a polysilicon gate electrode is deposited adjacent the gate oxide along the walls of the trench. The epitaxial layer allows the drain and source regions of the transistor to have substantially equal carrier concentrations, said concentrations being relatively low. As a result, the transistor operates the same regardless of whether the upper portion of the epitaxial layer serves as the drain or as the source, for digital logic applications. In addition, the relatively light doping of the source and drain regions provides for a high diode breakdown voltage, and prevents punch-through of the channel region at high bias voltages.

18 Claims, 4 Drawing Sheets

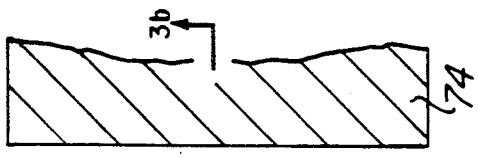
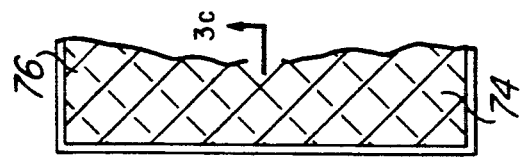
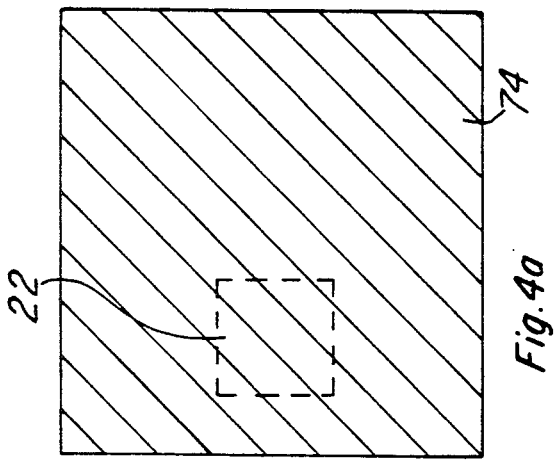
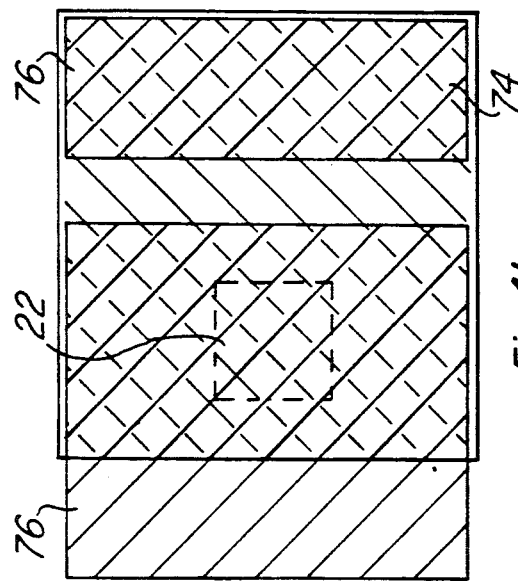
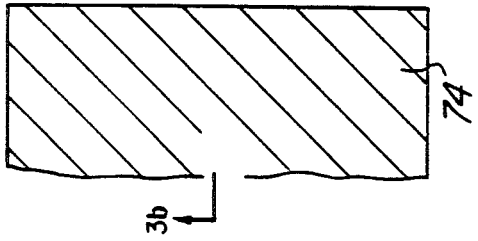
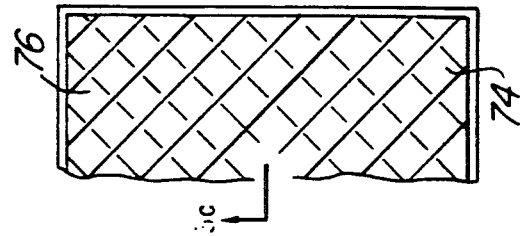

SYMMETRIC VERTICAL MOS TRANSISTOR WITH IMPROVED HIGH VOLTAGE OPERATION

This application is a continuation of application Ser. No. 07/485,806, filed Feb. 23, 1990 now abandoned, which is a continuation of application Ser. No. 07/135,489, filed Dec. 21, 1987 now abandoned, which is a continuation of application Ser. No. 06/921,727, filed Oct. 21, 1986 now abandoned.

This application is related to U.S. application Ser. No. 921,728, now abandoned filed Oct. 21, 1986 by Kiyoshi Mori, assigned to Texas Instruments, Incorporated and which is hereby incorporated into this application by this reference.

BACKGROUND OF THE INVENTION

This invention relates to semiconductor transistors, and specifically to insulated-gate field-effect transistors, such as metal-oxide-semiconductor (MOS) transistors.

Electronic devices ranging from discrete transistors to VLSI (Very Large Scale Integration) circuits have been improved in cost and performance in many ways over the past years. One of these ways is by reducing the size of the circuit elements used. A basic circuit element is the transistor, and in the more advanced and higher density circuits, the insulated-gate field-effect transistor (IGFET). Current technology primarily uses silicon as the semiconductor and silicon-oxide as the insulator in such transistors; the resultant transistor is thus commonly called the metal-oxide-semiconductor field-effect transistor, or MOSFET. Therefore, the smaller the MOSFET that can be fabricated, the more MOSFETs that can occupy a given surface area on a silicon slice, in turn allowing the manufacture of more complex and powerful VLSI circuits at reduced cost.

Limitations in the reduction in the size of the MOSFET often exist at the dimension of the channel length of the transistor. The channel is the area between the source and drain of a MOSFET which, in digital applications, is selectively made non-conductive and conductive to effect the desired digital operation. A well defined channel is therefore essential in fabricating a functional semiconductor device. However, as the desired channel length becomes increasingly smaller, small manufacturing errors, or small particulate contaminants, can more easily cause the channel to be permanently short-circuited, rendering the transistor and the VLSI device non-functional.

In addition, as is well known in the art, the channel length controls important electrical characteristics of the device. One of these characteristics is the value of the dependence on source-to-drain current on the gate voltage, commonly called the transconductance of the device. The switching speed of the transistor increases as the transconductance of the device increases. In order to fabricate an integrated circuit having the desired electrical behavior, the transconductance of the individual transistors within the integrated circuit must be well-controlled. This requires that the channel length of the MOS transistors in such devices must be well controlled.

It is therefore desirable that MOSFETs having very small yet controllable channel lengths be incorporated into VLSI circuit designs. Heretofore, the minimum channel lengths that have been controllable have been on the order of one micron (micrometer). Current methods, primarily photolithographic in nature, have precluded substantial manufacture of smaller transistors, since it is difficult for current equipment to print patterns of smaller than one micron, with tolerances better than 20%. If channel lengths vary by 20% within a device, or from device to device, the electrical performance of the circuits will be less than desired.

The above-referenced application describes a vertical transistor having a sub-micron channel length which can be manufactured in a highly controlled manner. This transistor is made by a process which has three diffusions to create the drain, channel and source regions, and which uses a trench cut through the diffusions so that the channel of the transistor is in a vertical direction, thereby consuming a minumum of silicon surface area and also minimizing parasitic capacitance. However, while such a transistor is easily manufactured using current techniques, the operation of the transistor is not symmetric relative to source versus drain bias. It is preferable in digital logic operations that the transistor operate the same regardless of which side of the channel is biased positive (i.e., serves as the drain in n-channel MOS) relative to the other side.

The transistor disclosed in the above-referenced application is designed for small-signal applications, since the high doping densities used in its construction, as well as the short channel length, limit the diode breakdown voltage of the source-channel p-n junction, and also cause the channel region to undergo "punch-through" at a relatively low voltage. These factors thereby limit the bias voltage which can be applied to the transistor.

It is therefore an object of this invention to provide an MOS transistor structure having a short channel length less than one (micron which is fabricated by a method allowing for a high degree of channel length control, wherein the operation of the transistor is independent of which side of the channel serves as the drain region.

It is a further object of this invention to provide a vertical MOS transistor structure having the advantages of a well-controlled channel length, minimized gate-to-drain capacitance, small utilization of silicon surface area, and which is capable of high-voltage operation.

It is a further object of this invention to provide an MOS transistor having the above advantages, and which has an improved diode breakdown voltage and an improved punch-through voltage.

Other objects and advantages of the invention will become apparent to those skilled in the art, having reference to the specification and the drawings below.

BRIEF DESCRIPTION OF THE DRAWINGS

FIGS. 4a through 4c are plan views illustrating the steps illustrated in FIGS. 3b through 3d.

SUMMARY OF THE INVENTION

The invention may be incorporated in an MOS field-effect transistor in which the gate oxide is deposited in a trench, and where the channel is fabricated in a vertical direction along one side of the trench. The transistor is fabricated by diffusion of the channel region into an epitaxial layer. This diffusion can be done in a number of stages. A first implant and diffusion is for forming an isolation region between adjacent transistors; this diffusion will reach to the substrate below the epitaxial layer. A second implant and diffusion may extend from the surface of the epitaxial layer, and will serve to isolate portions of the epitaxial layer from one another, so that the source and drain regions are not shorted together. A third stage is for forming a channel region below the surface of the epitaxial layer, said channel region connected to the region formed by the second implant and diffusion. After a trench is etched which extends through the epitaxial layer into the substrate and after gate oxide is grown in the trench, a gate electrode is conformally placed adjacent to the gate oxide. This gate electrode will control the conduction in the channel from source to drain, along the side of the trench. An electrode may be connected to the channel diffusion or to the substrate, for control of the transistor threshold voltage. The use of an epitaxial region to form the source and drain regions allows symmetric operation of the transistor, as well as increased diode breakdown and punch-through voltages.

DETAILED DESCRIPTION OF THE PREFERRED EMBODIMENT

Figure 1:
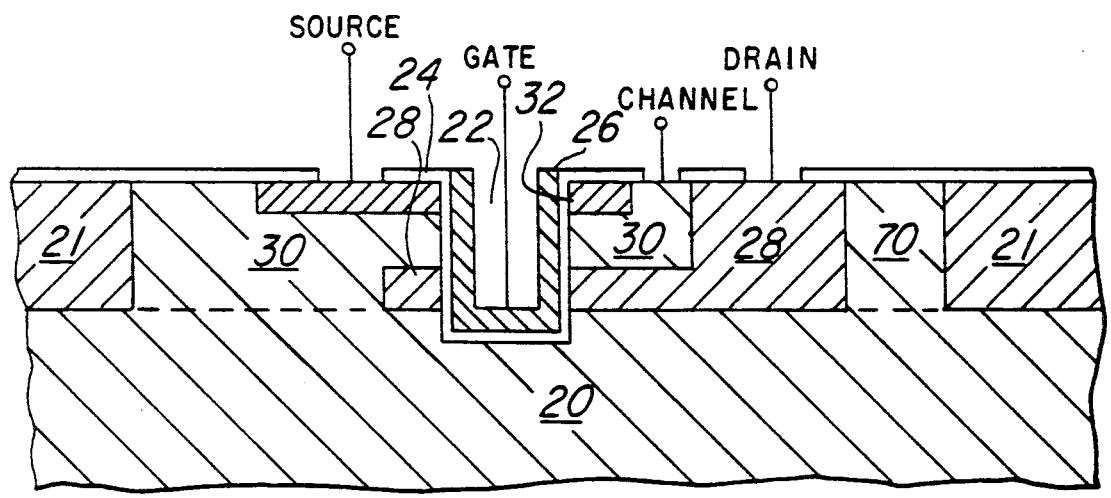
FIG. 1 is a cross-sectional view of a transistor fabricated according to the invention.

FIG. 1 is a cross-sectional diagram of a transistor constructed according to the preferred embodiment of the invention. This transistor is designed to have symmetry between the source and drain electrodes, to have improved diode breakdown characteristics, and also to have improved punch-through characteristics, allowing operation of the transistor at high bias voltages.

Referring to FIG. 1, substrate 20 is <100> lightly-doped p-type silicon. Drain region 28 and source region 32 are portions of n-type epitaxial layer 21 which is grown onto the surface of substrate 20 as the first step in fabrication of the transistor, as will be discussed below. Channel region 30 is a p-type region diffused into the n-type epitaxial layer, and is disposed between drain region 28 and source region 32. At the edge of drain region 28 is isolation region 70, useful in isolating adjacent transistors from one another on the same semiconductor chip. Portions of n-type epitaxial layer 21 are shown opposite from the active transistor regions to show the function of isolation regions 70; these portions of n-type epitaxial layer 21 may serve as source or drain regions in neighboring transistors, or merely as conductive interconnection regions. Trench 22 extends completely through the n-type epitaxial layer forming drain region 28, gate oxide 24 is grown conformal with the walls of trench 22, and gate electrode 26 is deposited upon gate oxide 24 to form the transistor.

Electrical connection to source region 32, drain region 28 and gate electrode 26 is schematically shown in FIG. 1; physical connection to these portions of the transistor may of course be made by any of the well-known methods for contacting regions within a semiconductor chip. In operation, a positive voltage is applied to drain region 28 relative to source region 32. The voltage of gate electrode 26 is selectively controlled to control the conductivity of channel region 30 between drain region 28 and source region 32, along the sides of trench 22. FIG. 1 in effect shows the transistor in the condition where the voltage applied to gate electrode 26 is significantly less than the voltage of drain region 28 plus the threshold voltage of the transistor, i.e., the channel between drain region 28 and source region 32 is not conductive. It should be noted that, depending upon such factors as the charge trapped at the interface between substrate 20 and gate oxide 24, and between gate electrode 26 and gate oxide 24, as well as the dopant concentration in channel region 30, the threshold voltage of the transistor may be less than zero; in such a case, of course, the voltage of gate electrode 26 will be negative relative to source region 32 in order to effect the condition shown in FIG. 1. In such a condition, the portion of channel region 30 adjacent to gate oxide 24 on all sides of trench 22 is still p-type, i.e., the majority charge carriers in said portion of channel region 30 are holes rather than electrons. As a result, reverse-biased p-n junctions are present between drain region 28 and channel region 30, and also between source region 32 and channel region 30, preventing current flow from drain region 28 to source region 32.

Figure 2:
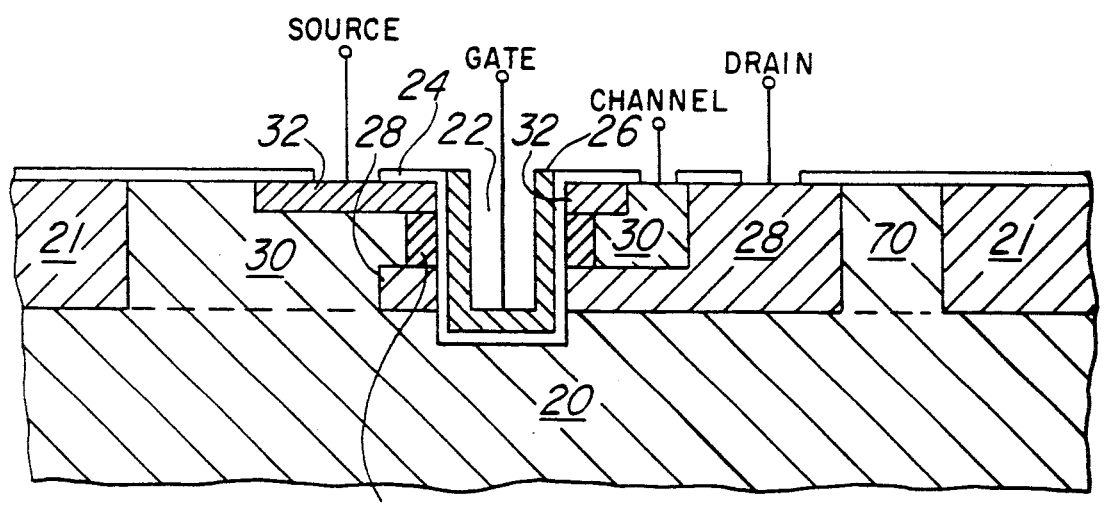
FIG. 2 is a cross-sectional view of the transistor of FIG. 1, illustrating the transistor in its "on" condition.

Referring now to FIG. 2, the condition of the transistor of FIG. 1 is shown with the voltage applied to gate electrode 26 being greater than the voltage of source region 32 by more than the threshold voltage of the transistor, and with a positive voltage applied to drain region 28 relative to source region 32. The positive voltage on gate electrode 26 relative to source region 32 has the effect of attracting free electrons from n-type source region 32 into channel region 30. If the voltage of gate electrode 26 is sufficiently high, the free electrons attracted into channel region 30 will exceed the number of holes provided by the boron dopant in channel region 30, so that electrons, rather than holes, are the majority charge carriers in these portions of channel region 30. Those areas within channel region 30 which have been inverted from p-type to n-type are shown in FIG. 2 as inversion regions 34. Inversion regions 34 are of course adjacent to gate oxide 24, i.e., at the point of the strongest electric field. The transistor threshold voltage is defined as the value of the differential voltage between gate electrode 26 and source region 32 at which inversion regions 34 completely extend from drain region 28 to source region 32. Therefore, when the gate-to-source voltage exceeds the threshold voltage as shown in FIG. 2, the p-n junctions which inhibited current flow from drain region 28 to source region 32 are no longer present, and current can now flow from drain region 28 to source region 32, through inversion regions 34. The transistor action occurs since the voltage applied to gate electrode 26 controls the conduction of current between drain region 28 and source region 32.

As is well known in the art, if a voltage is applied to the portion of an MOS transistor into which inversion regions 34 are to be formed, the threshold voltage can be modulated. Accordingly, a voltage applied to channel region 30 via the electrode schematically illustrated in FIGS. 1 and 2, will affect the value of the threshold voltage of the transistor. Physical contact to channel region 30 may either be made from the surface as suggested by FIGS. 1 and 2, or by contact to substrate 20. For the n-channel transistor illustrated in FIGS. 1 and 2, if a voltage is applied to channel region 30 which is negative relative to source region 32, the threshold voltage of the transistor will increase.

Figure 3A:
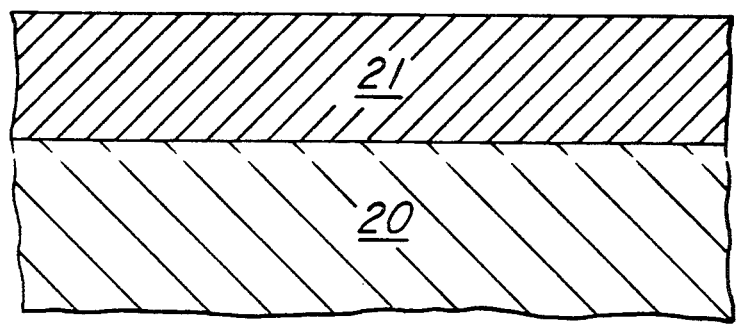
FIGS. 3a through 3d are cross-sectional views illustrating various steps in the fabrication of the transistor of FIG. 1.

Referring now to FIGS. 3a through 3d, the construction of the transistor according to FIG. 1 will be explained in detail. FIG. 3a shows the initial condition of substrate 20, having n-type epitaxial layer 21 grown thereupon by methods well known in the art. As an example, substrate 20 is lightly-doped p-type <100> silicon. Epitaxial layer 21 is also relatively lightly-doped, for example having an impurity concentration of $3E15$ ions/cm$^3$, with the dopant being arsenic. Epitaxial layer 21 is preferably at a thickness of 1.2 micron or less, in order to minimize parasitic gate-to-source and gate-to-drain capacitance.

Figure 3B:
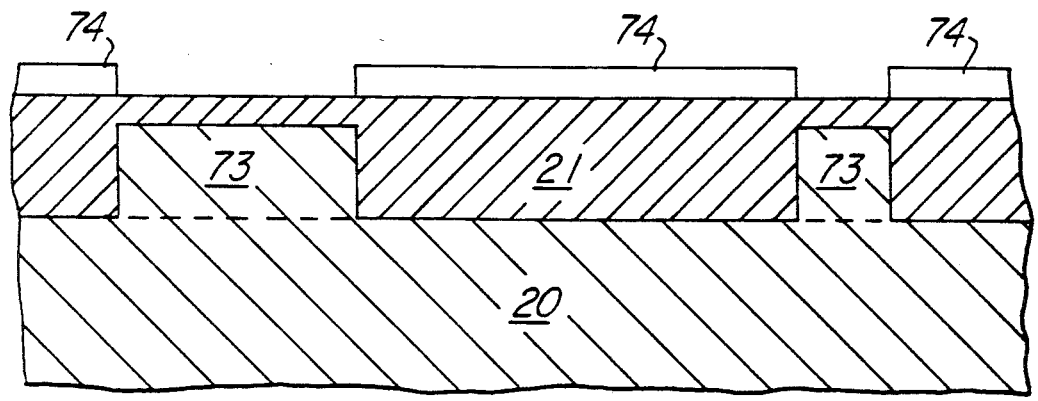

FIG. 3b shows the cross-section of the transistor after the first boron (p-type) implant and diffusion creating p-type areas 73. In order to selectively dope p-type areas 73, masking layer 74 is placed on the surface of substrate 20 (and n-type epitaxial layer 21). Masking layer 74 is fabricated by methods well known in the art for providing a mask for ion implantation, such that only selected areas of a silicon substrate are implanted with the ions from the ion beam. For example, a layer of photoresist which will provide a masking film if exposed to light and developed is spun onto substrate 20. A photomask which is opaque in the areas which are to be implanted, and transparent in the areas which are to be shielded from the implantation, is then placed adjacent to substrate 20, and the surface of substrate 20 is exposed to high intensity light. The photomask is removed, the photoresist developed, and the unexposed photoresist is removed from substrate 20, leaving a developed photoresist layer on substrate 20 over those areas which are to be shielded from ion implantation. Alternatively, a photoresist which provides a masking film if developed but not exposed to light may be used with a photomask which is opaque in the areas which are to be shielded from the implantation and transparent in the areas which are to be implanted. The end result of either technique is the presence of masking layer 74, as shown in FIG. 3b, which will prevent energized ions from reaching substrate 20 in the areas it covers. Referring to FIG. 4a, masking layer 74 is shown in a plan view of the transistor, with the area in which trench 22 will be etched shown for reference.

This first boron implant, and subsequent diffusion, is intended to create the boundaries of drain region 28 by isolation regions 70, and also the bounds of source region 32 to isolate it from drain region 28. Accordingly, as shown in FIG. 3b, the energy of this first implant is done at a sufficiently high energy (such as 260 keV) to cause the tops of p-type regions 73 to be below the surface of n-type epitaxial layer 21, and to cause p-type regions 73 to diffuse into p-type substrate 20. A typical dose for this implant is $5E14$ ions/cm$^2$.

Figure 3C:
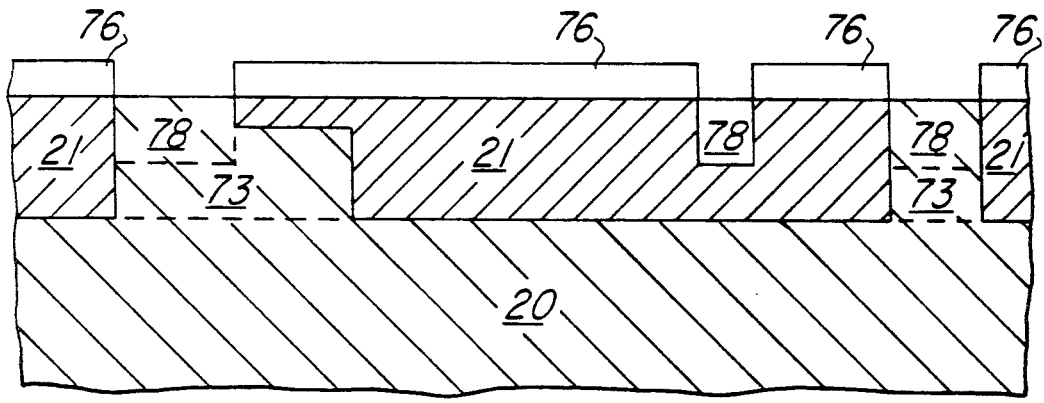

Referring to FIG. 3c, a cross-section of the eventual transistor is shown after a second masking operation and boron implant. This second boron implant, and subsequent diffusion, is required to complete the boundaries of source region 32, and to complete isolation region 70 between transistors. Referring to FIG. 3c, masking layer 76 is at the surface of epitaxial layer 21 in selected areas, by way of photolithography as before. FIG. 4b shows the relationship of masking layer 76 to masking layer 74; it should be noted that masking layer 76 leaves substantially same area exposed as masking layer 74 for isolation around the transistor. The region which masking layer 76 leaves exposed which is within masking layer 74 is necessary to isolate source region 32 from drain region 28, as will be shown below. P-type regions 78 are formed by the second implant and subsequent diffusion, p-type regions 78 overlapping into p-type regions 73 from the first boron implant and diffusion. At the right of FIG. 3c, for example, p-type region 78 overlaps into p-type region 73 (from FIG. 3b) to form isolation region 70. This second boron implant can be done with a relatively low energy levels, such as 50 keV, and with doses in the neighborhood of $8E14$ ions/cm$^2$.

Figure 3D:
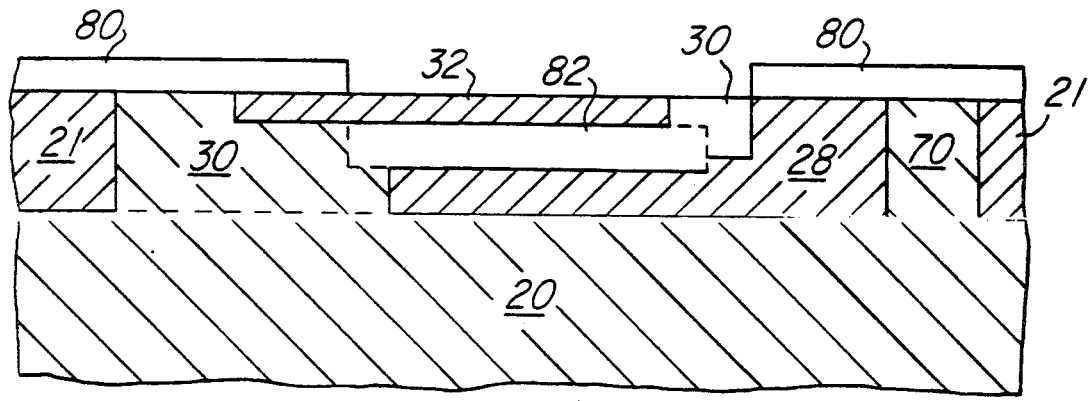
Figure 4C:
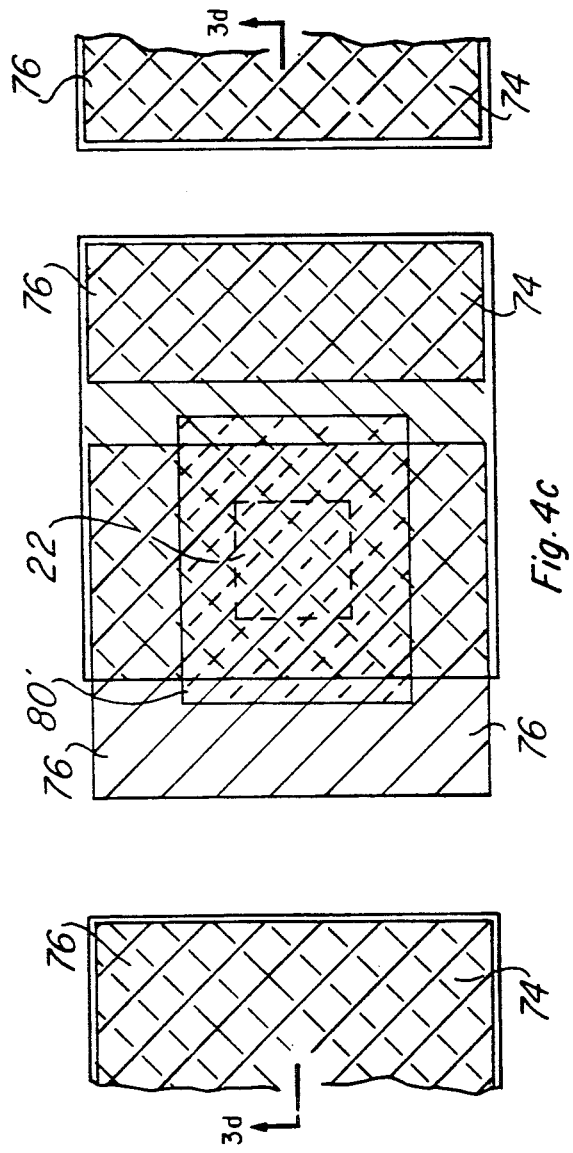

FIG. 3d illustrates the cross-section of the transistor after a third boron p-type implant and diffusion. This third implant and diffusion is required to form the portion of channel region 30 extending under the portion of n-type epitaxial layer 21 which will form source region 32. As before, masking layer 80 is formed on selected areas of the surface of epitaxial layer 21 by means of well-known photolithographic techniques. Referring to FIG. 4c, masking layer 80 is illustrated by illustration of exposed region 80'; exposed region 80' (the portion of the silicon which is not covered by masking layer 80) is used in FIG. 4c for clarity. The area shown in FIG. 4c by exposed region 80' will be implanted by boron ions in this third implant step. The third boron implant is done at a relatively high energy, such as 200 keV, in order to concentrate the boron dopant at a depth below the surface of n-type epitaxial layer 21. As shown in FIG. 3d, p-type region 82 is so formed by the third boron implant in the area not masked by masking layer 80. For example a 200 keV average carrier concentration in channel region 30 of $4E16$ holes/cm$^3$. In FIG. 3d, the combination of the three boron implants is shown as channel region 30, the portion of n-type epitaxial layer 21 above p-type region 30 is shown as source region 32, and the portion of n-type epitaxial layer 21 below p-type region 30 is shown as drain region 28.

Completion of the construction of the transistor requires etching of trench 22, growth or deposition of gate oxide 22, deposition of gate electrode 26, and electrical interconnection of drain region 28, source region 30, gate electrode 26, and possibly channel region 30. The fabrication techniques for completing the transistor are quite varied in the art, many such arrangements being useful in connection with the transistor described herein. A simple example of such an arrangement is illustrated in FIG. 5.

Figure 5:
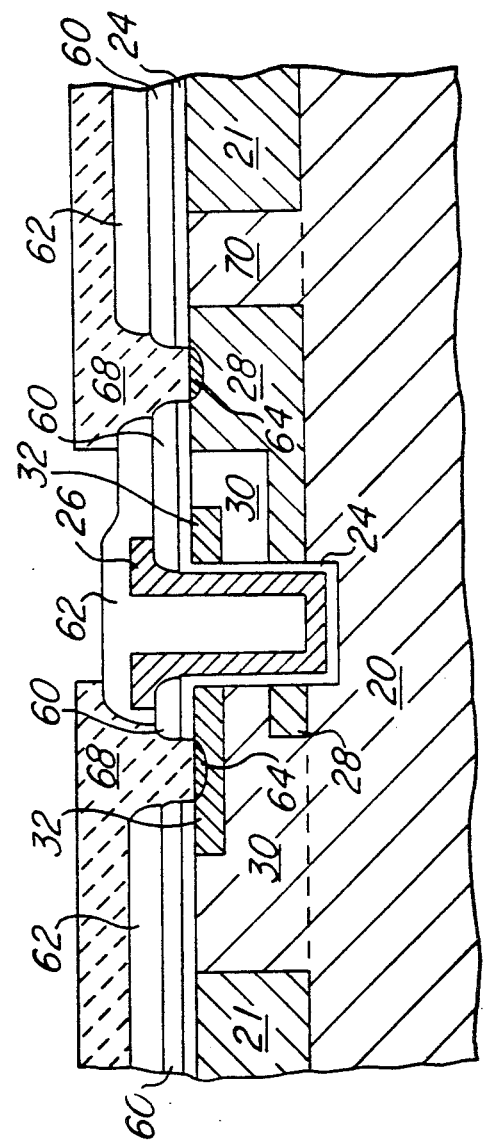
FIG. 5 is a cross-sectional view of the transistor of FIG. 1, further illustrating physical connection to the various regions therein.

Referring to FIG. 5, after the implant and diffusion steps described in detail above which form upper source region 32, lower drain region 28 Midelle and channel region 30, trench 22 is etched into the device. Trench 22 may be etched in the desired location, using techniques well known in the art, to extend through epitaxial layer 21 (i.e., through drain region 28) into substrate 20. Similarly as discussed in said application Ser. No. 921,728, parasitic gate-to-drain capacitance is minimized by trench 22 fully extending through drain region 28. Either before or after etching of trench 22, isolation oxide layer 60 may be either grown or deposited at selected locations on the top face of layer 21, also using techniques well known in the art. Isolation oxide layer 60 isolates the diffused regions from potential applied to gate electrode 26 and other interconnecting lines, because without sufficient oxide or other dielectric material under any extension of gate electrode 26 on the top face of layer 21, the potential applied to gate electrode 26 may be sufficient to turn on parasitic transistors formed at the top face of layer 21 by p-type regions disposed between two n-type regions in other areas of the device. After the placement of isolation oxide 60, gate oxide 24 is either grown or deposited to conformally coat the walls of trench 22, gate oxide 24 having a thickness of approximately 100 angstroms. A grown oxide is preferable for gate oxide 24 from an oxide quality standpoint; it should be noted that gate oxide 24 will also grow at the silicon interface under isolation oxide 60. Subsequent to the growth of gate oxide 24, a layer of polysilicon is deposited upon the top face, patterned and etched as desired to form gate electrode 26 and other conductive interconnections on substrate 20. Multilevel oxide layer 62 is then deposited to insulate gate electrode 26 from subsequent metallization interconnection lines.

Electrical connection to the active regions of the device are next made by currently available techniques in the art. In order to make contact to drain region 28 and source region 32, contact vias are etched through multilevel oxide layer 62, isolation oxide layer 60 and gate oxide 24; diffusion of additional arsenic or phosphorous is then performed into source region 32 or drain region 28, as indicated by diffusion areas 64. N-type diffusion areas 64 more heavily dope source region 28 and drain region 32 to improve the ohmic contact between the subsequent metallization and said n-type regions. In order to make contact to source region 32 and drain region 28, metallization layer 68 (consisting of a metal such as aluminum) is deposited, patterned and etched to contact to source region 32 and drain region 28. Contact (not shown) will similarly be made to gate electrode 26 by metallization layer 68 through multilevel oxide 62. A protective passivation overcoat (not shown) may be deposited over the whole of the structure of FIG. 5 for protection from mechanical scratches, contaminants, and moisture. It should be noted that channel region 30 may also have its own contact at the surface, or may use a connection to the bottom side of substrate 20 for the application of a bias voltage. Other variations to the transistor structure shown in FIG. 5 obvious to those skilled in the art may be utilized for specific purposes or in specific manufacturing processes without departing from the spirit of the invention, including but not limited to double-level polysilicon layers, double-level metallization, and use of an epitaxial substrate.

The transistor of FIG. 5, constructed as described above, has a channel length of 0.4 micron, an average carrier concentration in channel region 30 of 4E16 holes/cm$^3$ and an average carrier concentration in source region 32 and drain region 28 of 3E15 electrons/cm$^3$. Source region 32 and drain region 28 are each approximately 0.4 micron thick.

Copending application Ser. No. 921,728, incorporated by reference hereinabove, discloses a vertical MOS transistor where the drain, channel and source regions are fabricated by a triple diffusion process, i.e., the drain (n-type) diffusion is followed by a channel (p-type) diffusion, which is followed by a source (n-type) diffusion. This transistor is similar in structure to the transistor of FIG. 1, but certain features limit its use in many applications. First of all, both the channel region and source region of the triple-diffused transistor are heavily doped, since the p-type channel diffusion must overcome the n-type drain diffusion, and since the n-type source diffusion must overcome the p-type channel diffusion. As a result, the triple-diffused transistor has operating characteristics when the source is biased positive relative to the drain which are different from those when the drain is biased positive to the source. It is however preferable for transistors in a logic circuit to operate symmetrically, with the operation of the transistor independent of the bias of source versus drain.

The construction of the transistor of FIG. 5, however, provides for symmetric operation of the transistor of FIG. 1 since the carrier concentration of drain region 28 and source region 28 are substantially equal to one another, as they are each formed out of epitaxial layer 21, grown on substrate 20 prior to the fabrication of channel region 30 and trench 22. In the example discussed herein, the carrier concentration in source region 32 and drain region 28 is approximately 3E15 electrons/cm$^3$.

The relatively high carrier concentrations in the source and channel regions of the triple-diffused transistor contribute to other limitations of the device. First, as is well known in the art, the avalanche breakdown voltage of a p-n junction increases as the impurity concentration on the lightly-doped side of the junction decreases. Since the lightly doped side (the channel side) of the source-channel p-n junction of the triple diffused transistor is itself rather heavily doped, this junction will have a relatively low diode breakdown voltage, limiting use of the triple-diffused transistor in power or other high-voltage applications. Secondly, since channel region 30 of the transistor of FIG. 1 (and the triple-diffused vertical transistor) is less than a micron, punch-through of channel region 30 can occur in the event both source region 32 and drain region 28 are at a higher voltage than channel region 30, causing the depletion regions from the two reverse biased p-n junctions to come in contact with each other.

The transistor of FIG. 5 constructed according to the invention, provides for diode breakdown voltages of over 100 V, since the lightly doped side of the junction between channel region 30 and source region 32 is 3E15 electrons/cm$^3$. Relative to the punch-through of channel region 30, since source region 32 and drain region 28 are lightly doped relative to channel region 30, the bulk of the depletion regions in the reverse biased condition will extend into the n-type regions, rather than into channel region 30. As a result, even though channel region 30 is only 0.4 microns long, punch-through will not occur with source region 32 and drain region 28 at a voltage 20 V higher than the voltage of channel region 30. Such operating characteristics allow the transistor of FIG. 5 to be useful in logic circuits requiring symmetric source-drain operation, and in power circuits where the relative voltages can be in the 20 V range.

Although the invention has been described in detail herein with reference its preferred embodiment, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art without departing from the scope and spirit of the invention.

I claim:

1. A semiconductor insulated-gate field effect transistor, comprising:

A. a substrate of semiconductor material having a surface and being of a first conductivity-type;

B. a layer of semiconductor material formed on said surface of said substrate, said layer having a top face, and said layer formed to have a dopant of a second conductivity-type opposite said first conductivity-type of substantially uniform concentration throughout said layer;

C. a lower region formed in said layer and disposed within said layer substantially from said substrate surface upwardly to below said layer top face, said lower region having a peripheral boundary lateral of said layer and having a portion extending upwardly to said top face;

D. a middle channel region formed of part of said layer, said part containing a greater concentration of dopant of first conductivity type than the concentration of dopant of second conductivity type in said layer so as to cause said middle channel region to be of said first conductivity-type, said middle channel region disposed within said layer substantially from above a portion of said lower region upwardly to below said layer top face, said middle channel region having a first portion extending beyond said peripheral boundary of said lower region and extending downwardly to contact said substrate, and having a second portion extending upwardly to said top face;

E. an upper region formed in said layer and disposed within said layer from said middle channel region upwardly to about said top face, said upper region having a peripheral boundary lateral of said layer and said peripheral boundary being separated from said lower region by said middle channel region second portion;

F. a trench having sides formed through said layer through said lower, middle and upper regions and extending into said substrate;

G. an insulating layer of insulating material disposed along said trench and contacting said lower, middle and upper regions along the sides of said trench;

H. a conductive layer of conductive material formed on said insulating layer along the sides of said trench opposite said lower, middle and upper regions;

I. a first electrode connected to said lower region;

J. a second electrode connected to said upper region; and

K. a gate electrode connected to said conductive layer.

2. The transistor of claim 1 in which said lower and upper regions have impurity concentrations significantly lower than an impurity concentration of said middle region.

3. The transistor of claim 2 in which said lower and upper regions have impurity concentrations of about 3E15 electrons/cubic cm and said middle region having an impurity concentration of about 4E16 holes/cubic cm.

4. The transistor of claim 1 in which said layer of semiconductor material is an epitaxial layer.

5. The transistor of claim 1 in which said middle channel region is an implanted region within said layer of semiconductor material.

6. The transistor of claim 1 in which said layer of semiconductor material is no greater than about 1.2 microns thick.

7. The transistor of claim 6 in which said middle channel region between said lower and upper regions has a channel length of about 0.4 microns.

8. The transistor of claim 1 in which one of said upper and lower regions is a source and the other is a drain.

9. The transistor of claim 1 in which said upper region is a source and said lower region is a drain.

10. A semiconductor insulated-gate field effect transistor comprising:

A. a substrate of semicondutor material having a surface and being of a first conductivity-type;

B. a layer of semiconductor material formed on said surface of said substrate, said layer having a top face, and said layer formed to have a dopant of a second conductivity-type opposite of said first conductivity-type of substantially uniform concentration throughout said layer;

C. a middle channel region formed of part of said layer of semiconductor material, said part containing a greater concentration of dopant of first conductivity type than the concentration of dopant of second conductivity type in said layer so as to cause said middle channel region to be said first conductivity-type, said middle region having a channel portion below said top face and above said surface and having end portions extending downwardly to said substrate and upwardly to said top face, said middle channel region defining a lower region in said layer below said middle channel region, defining an upper region in said layer above said middle channel region, and separating said lower and upper regions from one another;

D. a trench having sides formed through said layer through said lower, middle and upper regions and extending into said substrate;

E. an insulating layer of insulating material disposed along said trench and contacting said lower, middle and upper regions along the sides of said trench;

F. a conductive layer of conductive material formed on said insulating layer along the sides of said trench opposite said lower, middle and upper regions;

G. a first electrode connected to said lower region;

H. a second electrode connected to said upper region; and

I. a gate electrode connected to said conductive layer.

11. The transistor of claim 10 in which said lower and upper regions have impurity concentrations significantly lower than an impurity concentration of said middle region.

12. The transistor of claim 11 in which said lower and upper regions have impurity concentrations of about 3E15 electrons/cubic cm and said middle region having an impurity concentration of about 4E16 holes/cubic cm.

13. The transistor of claim 10 in which said layer of semiconductor material is an epitaxial layer.

14. The transistor of claim 10 in which said middle channel region is an implanted region within said layer of semiconductor material.

15. The transistor of claim 10 in which said layer of semiconductor material is no greater than about 1.2 microns thick.

16. The transistor of claim 15 in which said middle channel region between said lower and upper regions has a channel length of about 0.4 microns.

17. The transistor of claim 10 in which one of said upper and lower regions is a source and the other is a drain.

18. The transistor of claim 10 in which said upper region is a source and said lower region is a drain.

* * * * *